United States Patent [19]

Druschke et al.

[11] Patent Number: 4,557,796

[45] Date of Patent: Dec. 10, 1985

[54] METHOD OF DRY COPPER ETCHING AND ITS IMPLEMENTATION

[75] Inventors: Frank Druschke, Stuttgart; Georg Kraus, Wildberg; Ulrich Kuenzel, Kusterdingen; Wolf D. Ruh, Sindelfingen; Rolf Schaefer, Gaertringen-Rohrau, all of Fed. Rep. of Germany

[73] Assignee: International Business Machines Corporation, Armonk, N.Y.

[21] Appl. No.: 636,660

[22] Filed: Aug. 1, 1984

[30] Foreign Application Priority Data

Aug. 2, 1983 [EP] European Pat. Off. ........ 83107604.7

[51] Int. Cl.[4] ............................ C23F 1/02; B44C 1/22; C03C 15/00; C03C 25/06
[52] U.S. Cl. .................................... 156/643; 156/646; 156/656; 156/659.1; 156/666; 204/192 E; 252/79.1
[58] Field of Search ................... 252/79.1, 79.3, 79.4; 156/643, 646, 656, 659.1, 666; 204/192 E; 427/38, 39

[56] References Cited

U.S. PATENT DOCUMENTS 4,416,725 11/1983 Cuomo et al. ................... 156/345 X
4,468,284 8/1984 Nelson ........................... 156/646 X

*Primary Examiner*—William A. Powell
*Attorney, Agent, or Firm*—Wolmar J. Stoffel

[57] ABSTRACT

According to this method, copper is dry etched in a glow discharge containing compounds with at least one methyl or methylene group, particularly at temperatures close to room temperature.

The method is applied in particular for making conductors on or in module substrates or circuit cards, solder spots, and the wiring of magnetic thin films.

13 Claims, No Drawings

METHOD OF DRY COPPER ETCHING AND ITS IMPLEMENTATION

DESCRIPTION

1. Technical Field

The invention relates to a method of dry copper etching in a glow discharge containing organic compounds, and to an implementation of the method.

2. Background Art

Owing to its excellent electric characteristics, copper is widely used as conductor material when making connections on module substrates, printed circuit cards and magnetic thin film heads. The connections are generally made photolithographically from an applied copper layer. Following the above method the copper layer, after a photoresist pattern corresponding to the connections has been made thereon, is preferably etched off selectively, with the pattern of the connections remaining. For etching the copper mostly wet chemical processes are still used at present. With the increasing microminiaturization of electronic circuits however it is getting more and more difficult to make connections with the necessary precision in a wet chemical mode. Furthermore, the etching baths deposit impurities on the parts to be etched, and these impurities are getting increasingly intolerable owing to the growing microminiaturization. For that reason, it has already been attempted to develop satisfactory dry etching processes for copper. From the article "Surface texturizing of copper by sputter etching with applications for solar selective absorbing surfaces" by P. M. Curmi and G. L. Harting, published in Journal of Vacuum Science Technology, Vol. 17 (6), November/December 1980, pp. 1320 ff. it is known to remove copper by means of cathode sputtering in an argon atmosphere. This method has of course all disadvantages of cathode sputter etching, i.e. especially that the material removed is deposited again at least partly on the parts to be etched. Furthermore, the minimum test temperature to which the copper sample had been heated during etching range between 300 and 400° C. with a variation of ±50° C. As in almost all implementations the copper is selectively covered with a polymer layer, and/or deposited on a substrate of synthetic material temperatures of 400° C. must on no account be exceeded during etching, and it is desirable that the temperatures used are considerably lower.

Copper was also etched by plasma etching and reactive ion etching. These methods are very successfully applied for a great number of metals, halogen compounds being generally used as etching reagents. The problem with copper is that its halogen compounds are volatile at relatively high temperatures only. Thus, a plasma etching process for copper has been described where the etching reagent consists of iodine which with the copper forms copper-iodide, but which is volatile at temperatures of more than 500° C. only. Therefore, this method cannot be applied for the above mentioned uses. European patent application No. 00 54 663 furthermore describes a method for removing copper by means of reactive ion etching in an atmosphere containing carbon and alcohol. In this method, too, the necessary temperatures are higher than 225° C.; furthermore, organic polymers are degrading there which are used as masks or substrates.

DISCLOSURE OF THE INVENTION

It is the object of the invention to provide a method of dry copper etching, where the copper is at least partly removed chemically, and which is implemented at minimum temperatures.

The reaction mechanism is not known. Although it is assumed in the book "The Chemistry of Organometallic Compounds" by E. G. Rochow et al., p. 253 that $CH_3Cu$ is forming when copper is exposed to a flowing atmosphere of methyl chloride, with a transport of copper taking place, it appears rather improbable that the reactions described in the book have anything in common with those taking place in the method as disclosed by the invention since Rochow did not operate in a glow discharge. In the method according to the invention, polymeric layers are not attached, with the result that the method according to the invention can also be used advantageously when copper is to be etched which for selective etching is partly covered with a mask of a photoresist or any other polymeric material, and/or applied on a substrate consisting of a polymeric material. In the method according to the invention, copper is removed—with a very low power—at temperatures of less than 80° C. already with a considerable speed (0.2-1.0 nm/sec), while the reactions described in the above cited book take place at temperatures between 250° and 300° C. The removal speed can be increased by increasing the output, and/or the temperature. The method according to the invention can thus be applied in particular to the production of conductors on or in module substrates and circuits, of soldering dots and of the wiring for magnetic thin film heads.

The method according to the invention can be advantageously used in the plasma etching as well as in the reactive ion etching mode.

Further advantageous developments of the method as disclosed by the invention are given in the subclaims.

BEST MODE FOR CARRYING OUT THE INVENTION

The invention will be described below with reference to embodiments.

The dry etching process according to the invention can be implemented in the form of all dry etching processes where the material to be etched is chemically attacked. In the following, the method as disclosed by the invention is described in detail with the examples of plasma etching and reactive ion etching, since these two dry etching methods are particularly suitable for demonstrating all specific features of this method. Reactive ion etching and a suitable reactor are specified e.g. in U.S. Pat. No. 3,994,793. Such a reactor comprises a reaction chamber which is surrounded by a casing connected to ground and including at least one gas inlet and one gas outlet, and in which a disk-shaped cathode is horizontally arranged carrying the substrates to be etched. A high frequency voltage is applied to the cathode. The reactor casing is the anode, and between anode and cathode, from an atmosphere containing a reactive gas a plasma is generated during etching in which the ionized particles are made which effect etching. In reactive ion etching which is preferably used in all those cases where structures with exactly vertical lateral walls are to be etched, ionized particles with a high kinetic energy are desirable, apart from a long mean free path of the ionized particles, which is achieved by a correspondingly low pressure in the reaction chamber. On the one hand, the material to be etched is removed physically, i.e. by the kinetic energy of the impinging ionized particles, and on the other chemically, i.e. by a reaction of the ionized particles formed in the plasma, with the material to be etched (ion-induced chemical etching). Depending on which of the two processes determines the speed of the removal of a predetermined material, the material is mentioned as an either mostly physically or mostly chemically etchable material.

For plasma etching a reactor can be used which is described in U.S. Pat. No. 3,757,733. It comprises in a reaction chamber two plate-shaped, e.g. round electrodes arranged in parallel to each other and superimposed on each other. The reaction chamber has at least one gas inlet and one gas outlet connected to a vacuum pump. The upper one of the electrodes is applied to a high frequency alternating voltage. The substrates to be etched are on the lower electrode. In the middle of the lower electrode there is an opening through which the gas needed for processing either flows into the space between the electrodes, or is removed therefrom by suction. Owing to this arrangement, a continuous gas stream flows over the substrates during etching either from the edge of the electrode space to the opening in the lower electrode, or in the opposite direction. During etching, a glow discharge is maintained between the electrodes which, as in reactive ion etching, has a double effect. On the one hand, the substrates re "bombarded" with gas particles which owing to the electric field between the electrodes are of a high kinetic energy, and on the other gas atoms or molecules in the glow discharge are ionized or at least chemically energized. The gases to be used are selected depending on the material to be etched, or to be used for coating. In plasma etching, the chemical reactions of the etching species with the substrates to be etched, as well as the bombarding with ionized gas particles initiate a chemo-physical removal of the material to be etched.

Plasma etching can also be implemented with an apparatus described in U.S. Pat. No. 3,795,557. In this apparatus, the parts to be etched are in a horizontal cylindrical vessel that can be closed with a gas-proof cover and which has at least one gas inlet for the reactive gases and a gas outlet connected to a vacuum pump. Wound on the outer surface of the cylindrical vessel a coil connected to an RF generator is provided through which the necessary energy is applied in order to maintain a plasma in the reaction vessel. In this apparatus, plasma etching is executed in the same manner as in the above described plasma reactor.

With the method according to the invention structures are etched in copper bodies. The copper is preferably available in the form of copper sheet, or of thin layers applied on substrates. The copper layers are applied on the substrates e.g. by evaporation, by electroless or electrolytic deposition, or by the lamination of copper foils. The substrate can consist of any material which under the conditions of the method according to the invention are not, or only negligibly attacked. Such materials are plastic material, some metals and ceramic materials. Copper can be etched in blanket or in selective mode. In the latter case, those regions of the copper surface that are not to be etched are covered with an etching mask. The mask preferably consists of a polymeric material, e.g. of one of the usual photoresists or of polyimide. As mentioned above, these materials are practically not attacked by the method as disclosed by the invention.

The copper bodies to be etched, e.g. copper layers applied on a plastic substrate are placed into the reaction chamber of one of the above mentioned reactors. This is followed by pumping-off to between 0.0133 and 1.33 mbar. The etching gas is subsequently directed into the reaction chamber either in its pure form or mixed with a carrier gas. If the boiling point of the connection used for etching is below room temperature, a gas cylinder containing the gas is connected to the reaction chamber; if the boiling point is above room temperature the vapor forming due to the vapor pressure of the compound available in its fluid form is continuously sucked into the reaction chamber. If a mixture of etching gas and carrier gas is used, carrier gas and reactive gas are homogeneously mixed prior to entering the reaction chamber.

As reactive gases or compounds, respectively, only that kind is used which contains at least one methyl or methylene group. Preerably, compounds selected from the group of methyl chloride, methyl bromide, methyl iodide, acetone, dibutandioles, methanol and diazomethane are used. As carrier gases inert gases as e.g. argon and nitrogen can be used. During etching, the temperature of the copper parts is maintained between 40° and 200° C., preferably at 50° C. approximately. The RF power is between 0.5 and 4 W/cm$^2$. Under the given conditions, the etch rate is between 0.2 and 1.0 nm/sec. The results were highly reproducible, and there was no copper redeposition, and also in those cases where the copper to be etched had been applied on a synthetic substrate, and/or where it had partly been covered with a mask of a polymeric material there was no polymeric deposition. From these results it can be concluded that during etching highly volatile copper compounds are formed, and that synthetic materials are not attacked, which indicates that if e.g. a methyl halide is used there is no forming of a copper halide because copper halides are less volatile. Possibly, methyl or methylene radicals are forming in the glow discharge which form volatile compounds with the copper either directly or via intermediate stages, and which relative to synthetic materials are—understandably—substantially inert. In the hitherto made tests with methyl halides the halogen did not react with the polymeric material. In order to exclude reliably even a minimum reaction of that kind, hydrogen can be admixed to the reaction gas.

The method as disclosed by the invention can be used advantageously in the production of copper conductors on or in (as far as multilayer versions are involved) ceramic components and printed circuit cards, of soldering spots and of the wiring for magnetic thin film heads. In the following, the method ad disclosed by the invention will be described with more detail with reference to two specific examples:

EXAMPLE 1

Etching took place in a reactor as described in U.S. Pat. No. 3,795,557, on copper films evaporated on synthetic or glass substrates. As an etching compound, pure methyl iodide was used. The flow of the (gaseous) methyl iodide was set to approximately 20 cm$^3$/min. The copper films to be etched were within the range of a 6 cm RF coil surrounding the glass reactor (inductive energy coupling). The glass reactor had a diameter of approximately 40 mm. The pressure n the glass reactor amounted to 0.04 mbar. The RF power was set to 0.8 W/cm². The substrate temperature measured was approximately 50° C. The copper was etched with a rate of approximately 0.6 nm/sec. There was no redeposition of copper and, with synethetic substrates being used, no polymer deposition.

EXAMPLE 2

The conditions of Example 2 differ from those of Example 1 only in so far as the samples to be etched are slightly outside the coil range during etching. Under these conditions, copper was removed completely and cleanly, and there was no redepositon of copper, or of polymer in connection with the use of synthetic substrates. As the samples were outside the range in which they can be impacted by particles accelerated in the electrical field of the coil, copper removal in this example was obviously realized via a chemical reaction with the copper exclusively, with volatile copper compounds being formed. (An additional physical removal of the copper is not to be excluded under standard conditions. If in selective etching of a copper layer vertical edges of the remaining copper are to be achieved it is even necessary to effect copper removal chemically as well as physically.) The results of Example 2 furthermore indicate that since a physical removal is impossible, a redeposition of material cannot be found not because the redeposited material is at once removed again physically, but because there actually is no such redeposition.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. Method of copper dry etching in a glow discharge containing organic compounds, characterized in that compounds with at least one methyl or methylene group are used for etching.

2. Method as claimed in claim 1, characterized in that at least one compound selected from the group of methyl chloride, methyl bromide, methyl iodide, methanole, acetone, dibutandioles and diazomethane is used.

3. Method as claimed in claim 2, characterized in that etching takes place at a copper temperature between 40° and 200° C.

4. Method as claimed in claim 1 characterized in that the copper is removed by means of plasma etching or reactive ion etching.

5. Method as claimed in claim 1 characterized in that the copper is etched selectively in the presence of polymers.

6. Method as claimed in claim 5, characterized in that prior to etching the copper is partly masked with a polymeric layer.

7. Method as claimed in claim 6, characterized in that the mask used consists of a layer of a polymer selected from the group of negative and positive resists and polyimide.

8. Method as claimed in claim 7, characterized in that copper is etched, that is, applied on a substrate of glass, ceramic, or plastic material.

9. Method as claimed in claim 8, characterized in that etching takes place with a methyl halide compound at a pressure between 0.0133 and 1.33 mbar and an RF power between 0.5 and 4 W/cm².

10. Method as claimed in claim 9, characterized in that etching takes place with methyl iodide at a pressure of approximately 0.04 mbar, an RF power of approximately 0.8 W/cm², and a copper temperature of approximately 50° C.

11. Method as claimed in claim 10, characterized in that hydrogen is admixed to the compound containing at least one methyl or methylene group.

12. Method as claimed in claim 11, characterized in that the compound containing at least one methyl or methylene group is mixed with an inert carrier gas, e.g. with argon or nitrogen.

13. The method as claimed in claim 1 characterized in that it is for making copper patterns, particularly conductors on or in ceramic components and cards, soldering spots, and the wiring of magnetic thin film heads.

* * * * *